US005361068A

United States Patent [19]

Llewellyn

[11] Patent Number: 5,361,068

[45] Date of Patent: Nov. 1, 1994

[54] LOW-CURRENT DIGITAL-TO-ANALOG CONVERTER

[75] Inventor: William D. Llewellyn, San Jose, Calif.

[73] Assignee: National Semiconductor Corporation, Santa Clara, Calif.

[21] Appl. No.: 42,305

[22] Filed: Apr. 2, 1993

[51] Int. Cl.[5] .......... H03M 1/66

[52] U.S. Cl. .......... 341/144; 341/118

[58] Field of Search .......... 341/118, 126, 144

[56] References Cited

U.S. PATENT DOCUMENTS

| | | | |
|---|---|---|---|
| 4,132,908 | 1/1979 | Hughes | 307/353 |
| 4,178,584 | 12/1979 | Davis | 341/134 |
| 4,712,091 | 12/1987 | Shoofs et al. | 341/133 |
| 5,034,744 | 7/1991 | Obinata | 341/118 |
| 5,105,193 | 4/1992 | Vogt et al. | 341/154 |
| 5,227,793 | 7/1993 | Aisu | 341/136 |
| 5,231,396 | 7/1993 | Yagi | 341/154 |

OTHER PUBLICATIONS

"DAC0800/DAC0801/DAC0802, 8-Bit Digital-to-Analog Converters", National Semiconductor Data Book 2, Rev. 1, 1988 Edition, pp. 4-6 to 4-10, 4-15, 4-19, 4-89 and 4-93.

*Primary Examiner*—Marc S. Hoff
*Attorney, Agent, or Firm*—Skjerven, Morrill, MacPherson, Franklin & Friel

[57] ABSTRACT

A current-multiplying digital-to-analog converter (DAC) produces a low-current output which has significantly reduced current spikes or "glitches" resulting from the inherent capacitances of the switching transistors. A transistor connected in what would normally be the output line of the DAC establishes a voltage which varies in proportion to the current in that line. This voltage is applied to the control terminal of a transistor in a second current line to regulate an output current which can be made very low without experiencing significant glitches. A DAC having differential outputs (actual and complementary values) is described.

39 Claims, 7 Drawing Sheets

LOW-CURRENT DIGITAL-TO-ANALOG CONVERTER

FIELD OF THE INVENTION

This invention relates to digital-to-analog converters (DACS) and, in particular, to current-multiplying DACS which convert a binary word to an analog value represented by an extremely small current.

BACKGROUND OF THE INVENTION

Current-multiplying digital-to-analog converters typically include a plurality of parallel conduction paths each of which is associated with one bit of the binary word which is to be converted to an analog value. The current magnitudes in the conduction paths are weighted by factors of two (often referred to as "binary weighting"). A switch included in each conduction path is controlled by the binary bit with which the path is associated. When a binary 1 is present at the input, the switch is closed and a current flows in the path. The currents in the paths are summed at a node, and the current emerging from the node is therefore representative of the binary word present at the input to the converter. In differential current DACS, double-poled switches are connected in each conduction path, and the DAC is provided with two outputs representative of the binary word and its complement.

While a variety of arrangements may be used to switch the currents in the conduction paths, these switches normally contain transistors. As is well known, transistors have inherent capacitances which yield current spikes or "glitches" as they are turned off and on. So long as the currents flowing through the DAC are fairly large these current glitches do not present a problem. However, since the glitch currents are of a fairly constant magnitude, they become proportionally more significant as the amount of current flowing through the converter is reduced. At current levels of 100 $\mu$A or less, the current glitches can become a significant problem, that is, they may come to represent an appreciable fraction of the DAC's output current, thereby degrading its performance.

SUMMARY OF THE INVENTION

In accordance with this invention, a first transistor is connected in what would normally be the output conduction path of a DAC. As the current in that path varies, the voltage across the first transistor is applied to the control terminal of a second transistor which is connected in a second conduction path. The control potential of the second transistor in turn controls the current flowing through the second conduction path, which is used as the output current of the DAC. The current flowing through the first transistor can be maintained at a relatively high level, thereby reducing the significance of current glitches, while the current through the second conduction path can be reduced to a very low level.

In a preferred embodiment, to avoid the instability that would occur if the current flowing through the first transistor fell to zero, a current source provides a minimal current through the first transistor, even when the input to the DAC is all zeros. A compensating current source is also connected to the second transistor so as to provide a net zero output current at the all-zeros condition. A current amplifier is used to insure that the output current is equal to the input current when the maximum binary word (all ones) is present at the input of the DAC.

In the preferred embodiment, two differential outputs are provided showing the actual value and its complement, respectively, of the binary input.

DESCRIPTION OF THE INVENTION

Figure 1:
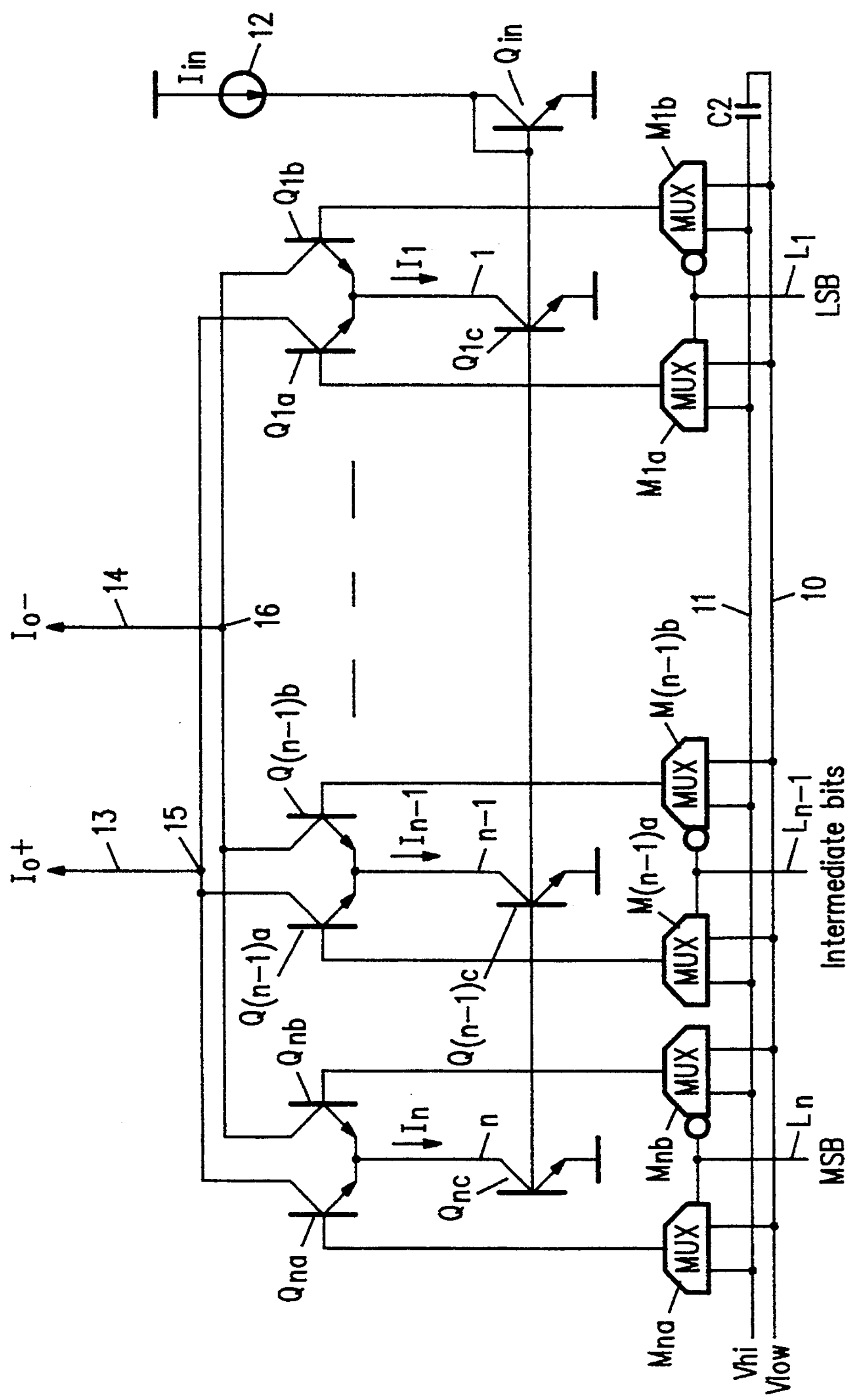
FIG. 1 illustrates a schematic diagram of a prior art DAC.

FIG. 1 illustrates a schematic diagram of a conventional current-multiplying DAC having a digital input of n binary bits. The input current $I_{in}$ is generated by a constant current source 12 and flows through a transistor $Q_{in}$. The collector and base of $Q_{in}$ are tied together, and $Q_{in}$ therefore acts as a diode which provides a steady reference voltage at its base terminal. The base terminal of transistor of $Q_{in}$ is tied to the respective bases of "current mirror" transistors $Q_{1c}$ through $Q_{nc}$. Transistors $Q_{1c}$ through $Q_{nc}$ are connected in conduction paths 1 through n, respectively. The currents in conduction paths 1 through n are designated $I_1$ through $I_n$, respectively. Transistors $Q_{1c}$ through $Q_{nc}$ are fabricated such that currents $I_1$ through $I_n$ differ from each other by a factor of two, i.e., $I_2$ is double $I_1$, $I_3$ is double $I_2$, etc. To accomplish this, the emitter area of each of transistors $Q_{1c}$ through $Q_{nc}$ is double that of the preceding transistor.

In reality, the emitter areas may be increased or precisely scaled by connecting several transistors in parallel, as is well known in the art. For example, transistor $Q_{2c}$ (not shown) may consist of two transistors connected in parallel, transistor $Q_{3c}$ (not shown) may consist of four transistors connected in parallel, and transistor $Q_{nc}$ may consist of $2^n$ transistors connected in parallel, with each of the parallel-connected transistors being identical to transistor $Q_{1c}$. This ensures that the currents in conduction paths 1 through n are related by a factor of two as nearly as possible.

Conduction paths 1 through n are connected together at a common node 15 and to a common node output line 13 which delivers the actual output current ($I_o$+). Conduction paths 1 through n are also connected together at a common node 16 and to a common node output line 14 which delivers a complementary output current ($I_o$−). These connections are made through paired transistors $Q_{1a}$ and $Q_{1b}$ for conduction path 1, and the corresponding paired transistors $Q_{(n-1)a}$ and $Q_{(n-1)b}$ for conduction path n-1, and $Q_{na}$ and $Q_{nb}$ for conduction path n. Each of transistors $Q_{1a}$ through $Q_{nb}$ is connected through a corresponding multiplexer $M_{1a}$ through $M_{nb}$ to lines 10 and 11. Line 10 is maintained at a voltage $V_{low}$ and line 11 is maintained at a voltage $V_{hi}$. $V_{low}$ is a voltage that will turn off transistors $Q_{1a}$ through $Q_{nb}$ when applied to the bases thereof, and $V_{hi}$ is a voltage which will turn on transistors $Q_{1a}$ through $Q_{nb}$ when applied to the bases thereof.

The binary input to the DAC is applied to lines $L_1$ through $L_n$, with $L_1$ holding the least significant bit and $L_n$ holding the most significant bit. Each of lines $L_1$ through $L_n$ is connected to the control terminals of a corresponding pair of multiplexers $M_{1a}$ through $M_{nb}$. For example, line $L_1$ is connected to control terminals of multiplexers $M_{1a}$ and $M_{1b}$, the input to multiplexer $M_{1b}$ being inverted. Thus, when a binary one appears at line $L_1$, multiplexer $M_{1a}$ connects line 11 to the base of transistor $Q_{1a}$, turning it on, and multiplexer $M_{1b}$ connects line 10 to the base of transistor $Q_{1b}$, turning it off. Conversely, if a binary zero appears at line $L_1$, transistor $Q_{1a}$ is turned off and transistor $Q_{1b}$ is turned on. As a result, when a binary 1 is at line $L_1$ current flows in output line 13 into conduction path 1, and when a binary zero appears at line $L_1$ current flows in output line 14 through conduction path 1. A capacitor $C_2$ stabilizes $V_{hi}$ and $V_{low}$ and prevents differential glitches from appearing on lines 10 and 11 as multiplexers $M_{1a}$–$M_{nb}$ are switched back and forth. This differential glitching would otherwise appear at all of the current switch inputs and would be coupled to the output of the DAC.

In a similar manner, the binary inputs at the remaining lines $L_2$ through $L_n$ determine whether current flows from output line 13 or output line 14 into the corresponding conduction paths. The current flowing in output line 13 therefore represents the summation of the currents flowing in each of conduction paths 1 through n which has a binary 1 at its associated input. Because the current in each of conduction paths 1 through n represents a binary digit at the associated input, the summation in output line 13 represents the binary word which is present at input lines $L_1$ through $L_n$.

Conversely, the current in output line 14 is the summation of the currents flowing in conduction paths 1 through n which have a binary 0 at their associated inputs, and it therefore represents the complement of the binary word appearing at input lines $L_1$–$L_n$.

Transistors $Q_{1a}$ through $Q_{nb}$, which together are used to switch the currents between output lines 13 and 14, have inherent parasitic capacitances. Thus, as the binary input changes and these transistors are switched on and off, current spikes or "glitches" are coupled through these parasitic capacitances (base to collector and base to emitter) and appear in output lines 13 and 14. The size of the current glitches is relatively constant and does not vary much with the size of the currents flowing in conduction paths 1 through n. So long as the currents flowing in conduction paths 1 through n are fairly large (for example, 100 μA or more) these glitch currents do not significantly affect the operation of the device. However, when the currents in the device fall below this level, the glitch currents begin to present a problem.

Figure 3A:
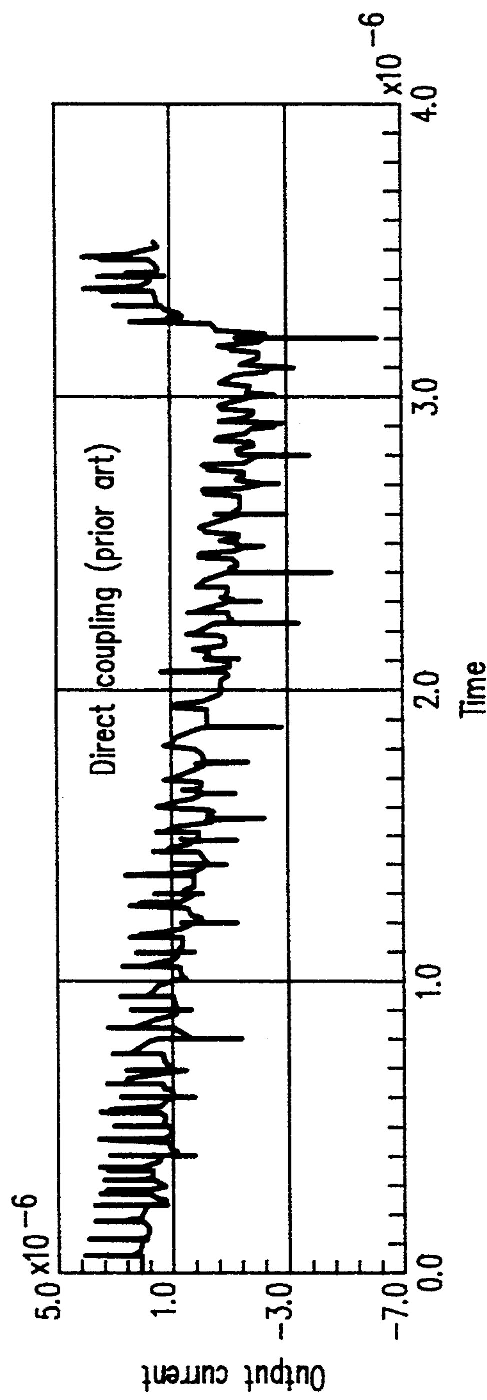
FIGS. 3A and 3B illustrate simulated outputs of the prior art DAC of FIG. 1 and the DAC of FIG. 2, respectively.

FIG. 3A illustrates the simulated output of a six-bit DAC as it cycles through 64 different states in sequence. The y-axis represents the DAC output current $(I_o+)$-$(I_o-)$ in amperes; the x-axis represents time in seconds; the digital input word is incremented by one least significant bit (LSB) every $0.05\times10^{-6}$ seconds. Each LSB increment represents a change of approximately $32\times10^{-9}$ amperes (32 nanoamperes) at the DAC output. As is evident from FIG. 3A, the glitch currents, which show up as overshoots as the DAC proceeds from one state to the next, have a very significant effect on the output of the DAC.

Figure 2:
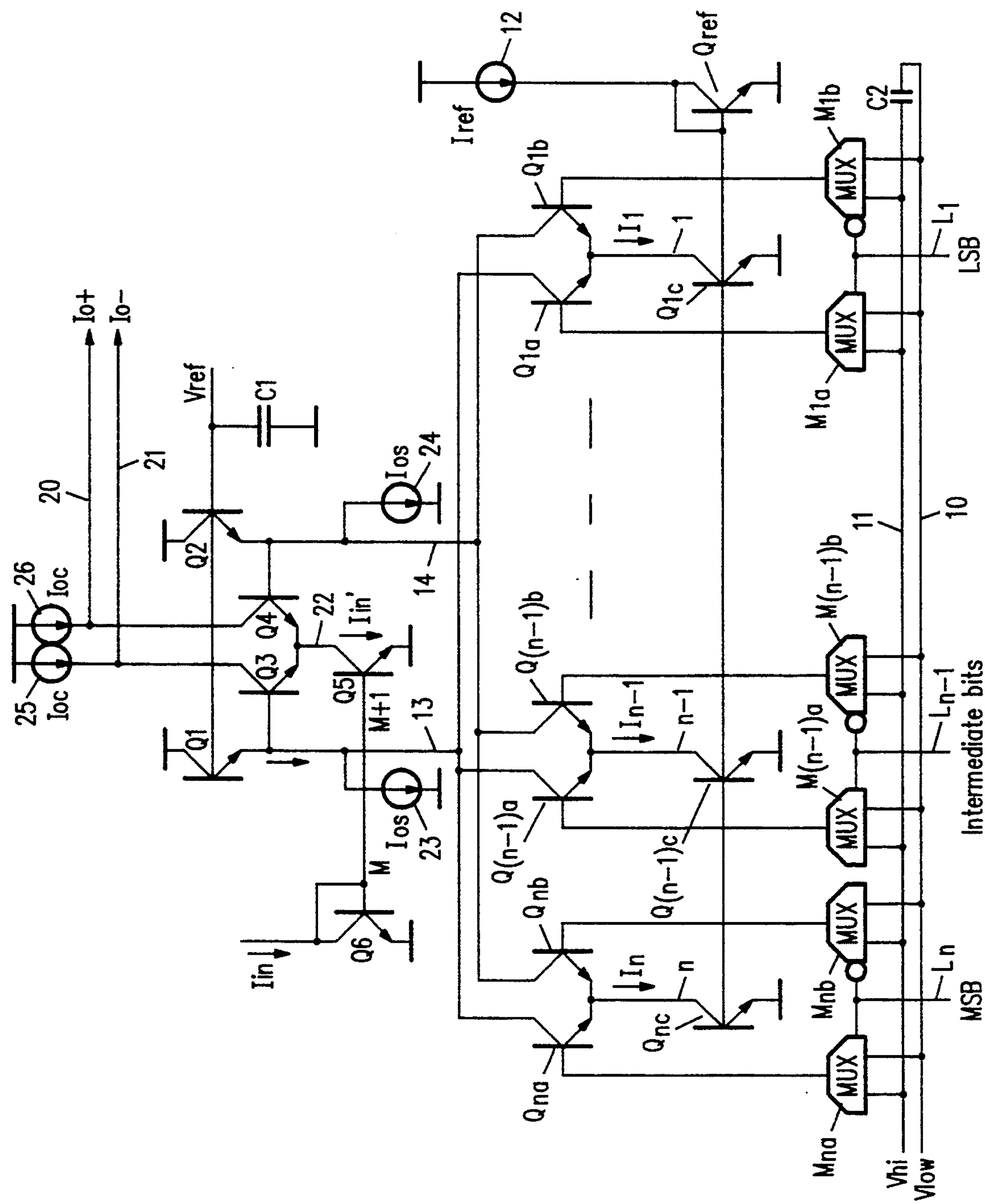
FIG. 2 illustrates a schematic diagram of a double-ended DAC according to the invention.

FIG. 2 illustrates a low-current DAC in accordance with the invention. Elements which are the same as those shown in FIG. 1 are similarly numbered. A transistor $Q_1$ is connected into line 13, with its collector coupled to a source of positive voltage. Similarly, a transistor $Q_2$ is connected into line 14, with its collector coupled to a source of positive voltage. The bases of transistors $Q_1$ and $Q_2$ are tied in common to a reference voltage $V_{ref}$. In this embodiment, $V_{ref}=3\ V_{be}$, or about 2.25 V. A capacitor $C_2$ stabilizes the reference voltage $V_{ref}$.

The remainder of the circuitry in the lower part of FIG. 2 is identical to that shown in FIG. 1, except that $I_{in}$ has been redesignated as a reference current $I_{ref}$ to indicate that it is no longer the input current for the DAC. (Transistor $Q_{in}$ has also been redesignated as transistor $Q_{ref}$.) Thus, as the binary bits at input lines $L_1$ through $L_n$ vary, the currents in lines 13 and 14 vary as described above. As a result, the emitter voltages of transistors $Q_1$ and $Q_2$ vary in a logarithmic manner such that the voltage difference developed between the emitters of transistors $Q_1$ and $Q_2$ contains a logarithmic representation of the difference between the currents in lines 13 and 14.

The emitters of transistors $Q_1$ and $Q_2$ are connected to the bases of transistors $Q_3$ and $Q_4$, respectively. The collector of transistor $Q_4$ is connected to a line 20 which carries the actual output current $(I_o+)$, and the collector of transistor $Q_3$ is connected to a line 21 which carries the complementary output current $(I_o-)$. The emitters of transistors $Q_3$ and $Q_4$ are connected via a line 22 through a transistor $Q_5$ to a source of negative voltage.

Assuming that transistors $Q_1$ and $Q_2$ are identical and transistors $Q_3$ and $Q_4$ are identical, it can be shown that the collector currents of these transistors are related as follows:

$$\frac{I_{Q1}}{I_{Q2}}=\frac{I_{Q4}}{I_{Q3}} \qquad (1)$$

This equation can be derived from the general equation for the base-emitter voltage ($V_{be}$) of a bipolar transistor:

$$V_{be}=V_t ln[I_c/I_{sat}] \qquad (2)$$

where $V_t$ is the diode potential of the transistor, $I_c$ is the collector current, and $I_{sat}$ is the junction saturation current.

Let $V_{e1}$ represent the emitter potential of $Q_1$, $V_{e2}$ represent the emitter potential of $Q_2$, etc. Applying the above equation to transistors $Q_1$–$Q_4$ yields the following.

$$V_{ref}-V_{e1}=V_t\ ln[I_{Q1}/I_{sat1}] \qquad (3)$$

$$V_{ref}-V_{e2}=V_t\ ln[I_{Q2}/I_{sat2}] \qquad (4)$$

$$V_{e1}-V_{e3}=V_t\ \ln[I_{Q3}/I_{sat3}] \qquad (5)$$

$$V_{e2}-V_{e4}=V_t\ \ln[I_{Q4}/I_{sat4}] \qquad (6)$$

$$I_{oc}=I_{Q5}/[(I_1+ \cdots +I_n)/I_{os}+2] \quad (23)$$

It can be seen from this last equation that if $I_{os}$ were zero, $I_{oc}$ would also be zero, i.e., there would be no output cancellation current needed because there would be no residual output current. If $I_{os}$ became very large (approached infinity) and swamped out $(I_1+ \cdots +I_n)$, then $I_{Q3}$ and $I_{Q4}$ would always be equal and thus the cancellation current would have to be $I_{Q5}/2$. The all-ones condition is the complement of the all-zeros condition, and the analysis is similar. Therefore, equation (23) also gives the required output current $I_{oc}$ for current source 25.

Figure 4A:
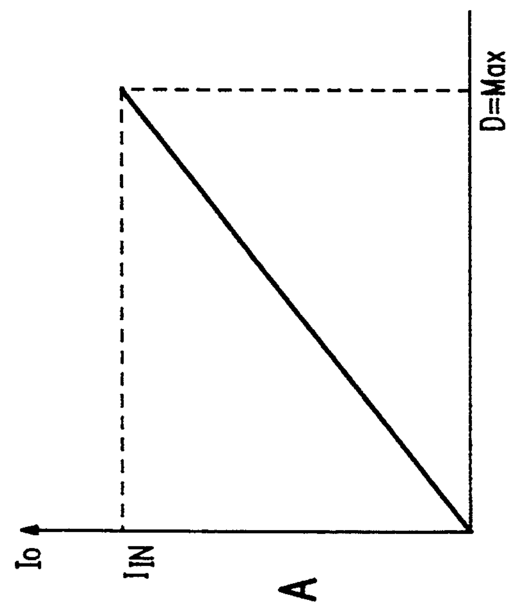
FIGS. 4A–4D illustrate graphically the adjustments that are required by the need to maintain a current in transistors $Q_1$ and $Q_2$ at all times.
Figure 4B:
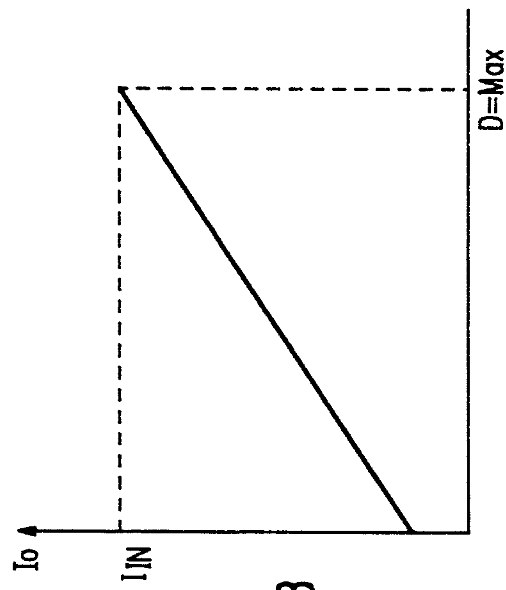
Figure 4C:
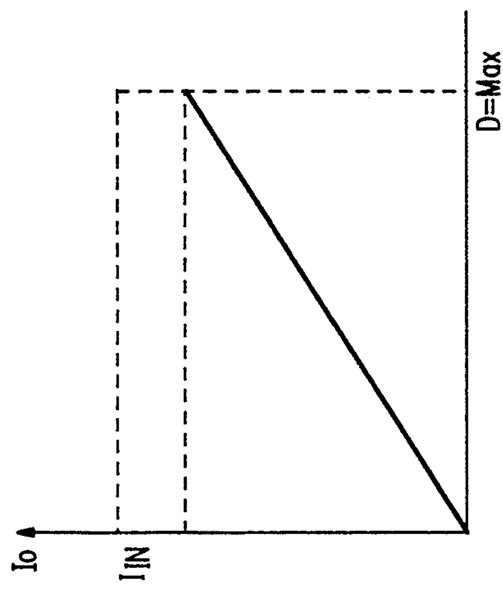

FIG. 4C illustrates the situation after compensation current sources 25 and 26 have been added. The analog output is now zero when the binary input is zero but, because the slope of the curve remains reduced, the output current at the maximum binary input ($I_o$max) is somewhat less than $I_{in}$.

To readjust the slope of the curve in FIG. 4C so that $I_o\text{max}=I_{in}$, it is necessary to add circuitry which multiplies the input current. This is done by means of transistors $Q_5$ and $Q_6$. Transistor $Q_6$ is connected in a current path which carries $I_{in}$, and its collector and base are shorted together. Thus, transistor $Q_6$ performs like a diode with its emitter-base voltage varying with $I_{in}$. The base of transistor $Q_6$ is tied to the base of transistor $Q_5$.

In order to re-achieve $I_o$max equal to $I_{in}$, the emitter area of transistor $Q_5$ is made larger than the emitter area of transistor $Q_6$. This provides current amplification. In an all-zeros condition, the output current $I_o-$ through line 21, which is $I_{Q3}-I_{oc}$, should equal $I_{in}$:

$$I_o-=I_{in}=I_{Q3}-I_{oc} \quad (24)$$

Recall that in an all-zeros condition, $$I_{oc}=I_{Q4} \quad (25)$$

Thus, $$I_o-=I_{in}=I_{Q3}-I_{Q4} \quad (26)$$

Recall also that $$I_{Q4}=I_{Q5}/[(I_1+ \cdots +I_n)/I_{os}+2] \quad (27)$$

and $$I_{Q3}=I_{Q5}-I_{Q4} \quad (28)$$

Thus $$I_{in}=I_{Q5}-2I_{Q4} \quad (29)$$

$$I_{in}=I_{Q5}-2I_{Q5}/[(I_1+ \cdots +I_n)/I_{os}+2] \quad (30)$$

$$I_{in}=I_{Q5}]1-2/[(I_1+ \cdots +I_n)/I_{os}+2] \quad (31)$$

$$I_{in}/I_{Q5}=[1-2/[(I_1+ \cdots +I_n)/I_{os}+2]] \quad (32)$$

Inverting, $$I_{Q5}/I_{in}=1/\{[1-2/[(I_1+ \cdots + \text{i } I_n)/I_{os}+2]]\} \quad (33)$$

Rearranging, $$I_{Q5}/I_{in}=1+2I_{os}/(I_1+ \cdots + I_n) \quad (34)$$

The ratio $I_{Q5}I_{in}$ is the emitter area ratio of $Q_5$ to $Q_6$ which will achieve restoration of $I_o$max to equality with $I_{in}$.

Figure 4D:
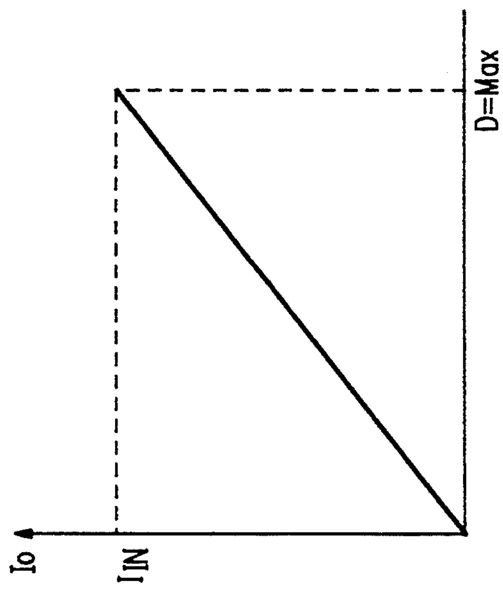

As a result of these adjustments, the DAC operates as shown in FIG. 4D, which is identical to FIG. 4A.

Figure 3B:
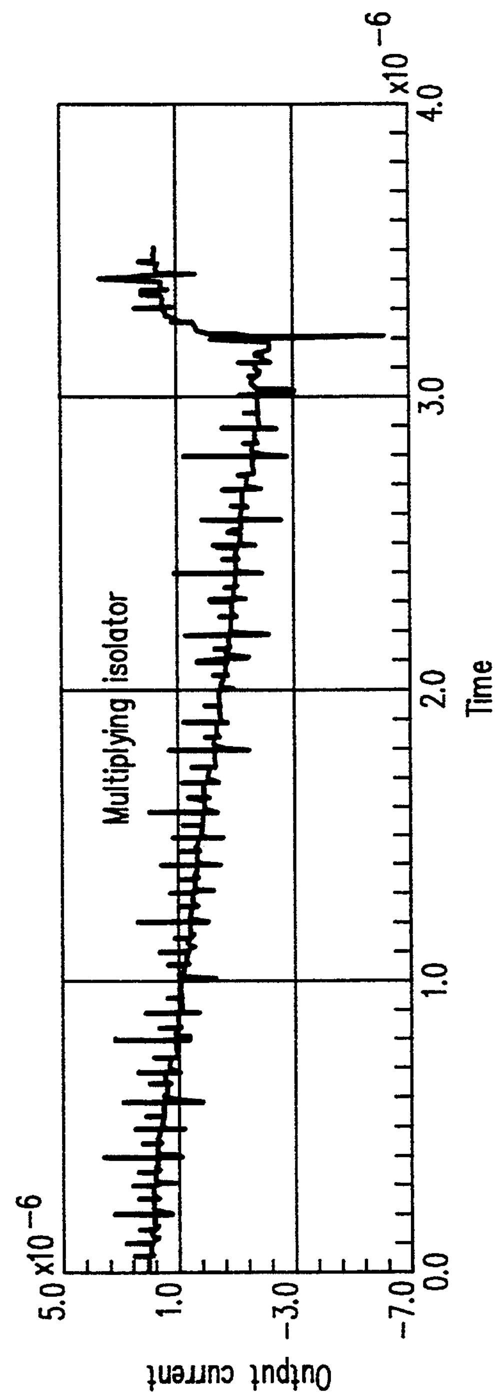

FIG. 3B illustrates by computer simulation the performance of a DAC in accordance with this invention, using the test and parameters described in FIG. 3A. By comparing FIG. 3B with FIG. 3A, one can see that the current glitches in a DAC according to this invention are substantially reduced.

Figure 5:
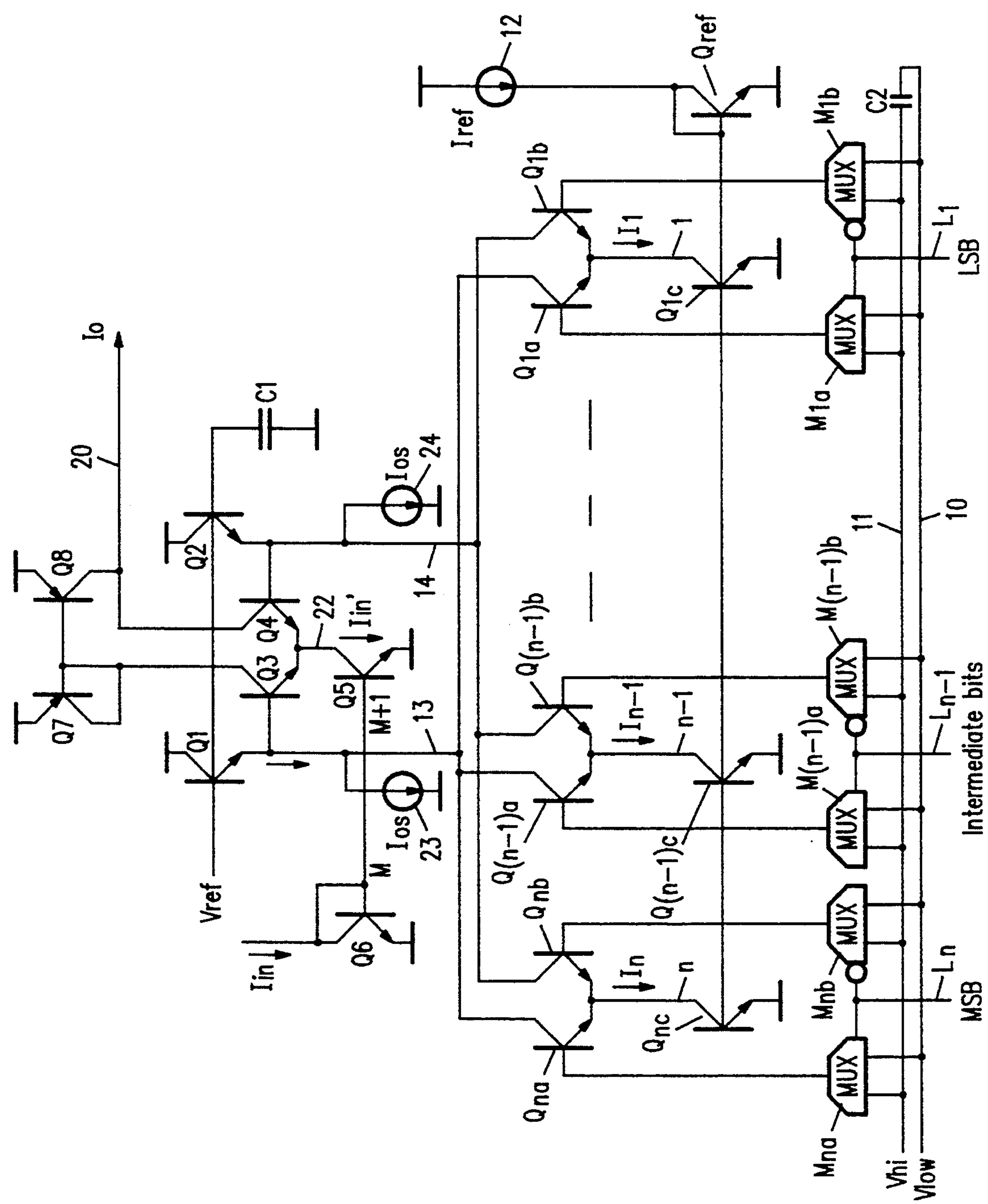
FIG. 5 illustrates a schematic diagram of a single-ended embodiment according to the invention.

The DAC illustrated in FIG. 2 is double-ended or differential in the sense that actual and complementary analog representations of the binary input appear on lines 20 and 21, respectively. FIG. 5 illustrates a single-ended version of the DAC which provides a push-pull output current which can be either source or sink, depending on whether the value of the input binary word is above or below its median value. In the DAC of FIG. 5, transistors $Q_7$ and $Q_8$ obviate the need for compensation current sources 25 and 26. It can be seen that if current sources 25 and 26 were to be added to the circuit of FIG. 5 at the collectors of transistors $Q_3$ and $Q_4$, as they are in FIG. 2, their currents would cancel each other by the effect of current mirror Q7/Q8. Thus, current sources 25 and 26 become unnecessary in the single-ended output embodiment.

Figure 6:
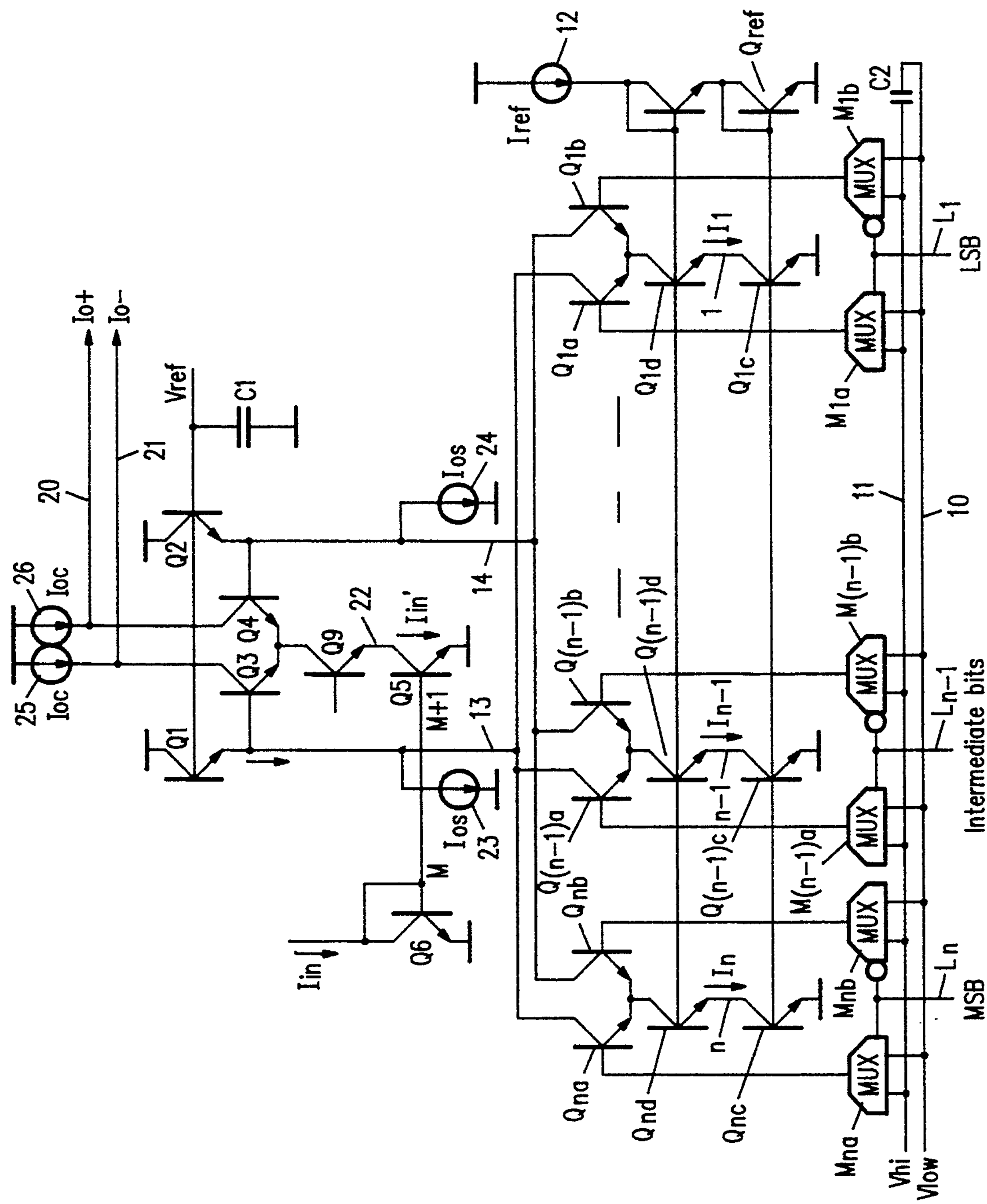
FIG. 6 illustrates a modification of the DAC of FIG. 2 using a cascoded arrangement to further reduce current glitches.

An embodiment of a DAC which is even less susceptible to current glitches is shown in FIG. 6. This is similar to the embodiment shown in FIG. 2 except that it is a cascoded arrangement with transistors $Q_{1d}$–$Q_{nd}$ connected in conduction paths 1-n and with a transistor $Q_9$ connected to the collector of transistor $Q_5$. The bases of transistors $Q_{1d}$–$Q_{nd}$ are maintained at a reference voltage provided at the base of a transistor $Q_{10}$, which is 2 $V_{be}$, or about 1.5 V, above negative supply. The reference voltage for transistors $Q_{1d}$–$Q_{nd}$ could be provided in other ways. Similarly, the base of transistor $Q_9$ is maintained at a reference voltage equal to 2 $V_{be}$.

Transistor pairs $Q_{1a}$–$Q_{1b}$ through $Q_{na}$–$Q_{nb}$ are differential current switches. As any pair is switched, a minor voltage disturbance will occur at the common emitter node. This will produce a glitch in the corresponding current ($I_1$–$I_n$), which will be proportional to the parasitic capacitance seen at the collector of the corresponding transistor $Q_{1c}$–$Q_{nc}$. Since transistors $Q_{1c}$–$Q_{nc}$ are generally large for reasons of current scaling or device matching, they may have large parasitic capacitances, and significant glitches may occur as currents are switched in conduction paths 1-n. This problem can be lessened by including cascode transistors $Q_{1d}$–$Q_{nd}$ in conduction paths 1-n. Cascode transistors $Q_{1d}$–$Q_{nd}$ may be made significantly smaller than transistors $Q_{1c}$–$Q_{nc}$ so that they proportionally reduce the current glitches that are passed to transistors $Q_{1a}$–$Q_{nb}$ and to the output of the DAC. Similarly, cascode transistor $Q_9$ reduces the current glitches that are produced as the voltage at the common emitters of transistors $Q_3$ and $Q_4$ is varied.

While specific embodiments of this invention have been disclosed, it will be clear to those skilled in the art that many additional or alternative embodiments may be constructed in accordance with the broad principles of the invention. For example, there are many alternative ways of switching the currents in the circuit in addition to the multiplexer arrangement illustrated in FIG. 2. Among the possible alternatives is the circuitry for the DAC0800 series of 8-bit digital-to-analog converters described at pages 8–118 to 8–120 of the National Semiconductor Linear Products Databook (1982). Moreover, while in the embodiments described transistors $Q_1$–$Q_4$ are shown as bipolar transistors, other devices such as MOSFETS may be used.

This invention is furthermore not limited to DACs which use binary weighted currents in parallel conduction paths to produce an analog current output. It is also applicable to other types of DACs, such as those which use a decoder to provide an output representative of the value of the binary input. For example, the decoder in a 6-bit DAC would have 64 output lines; if the input were 100100, 36 of the output lines would be active. Each active line results in the generation of a current having a magnitude equal to the other currents, and all of the currents are summed to provide an analog output. This type of DAC is sometimes referred to as a "thermometer type" DAC.

Figure 7:
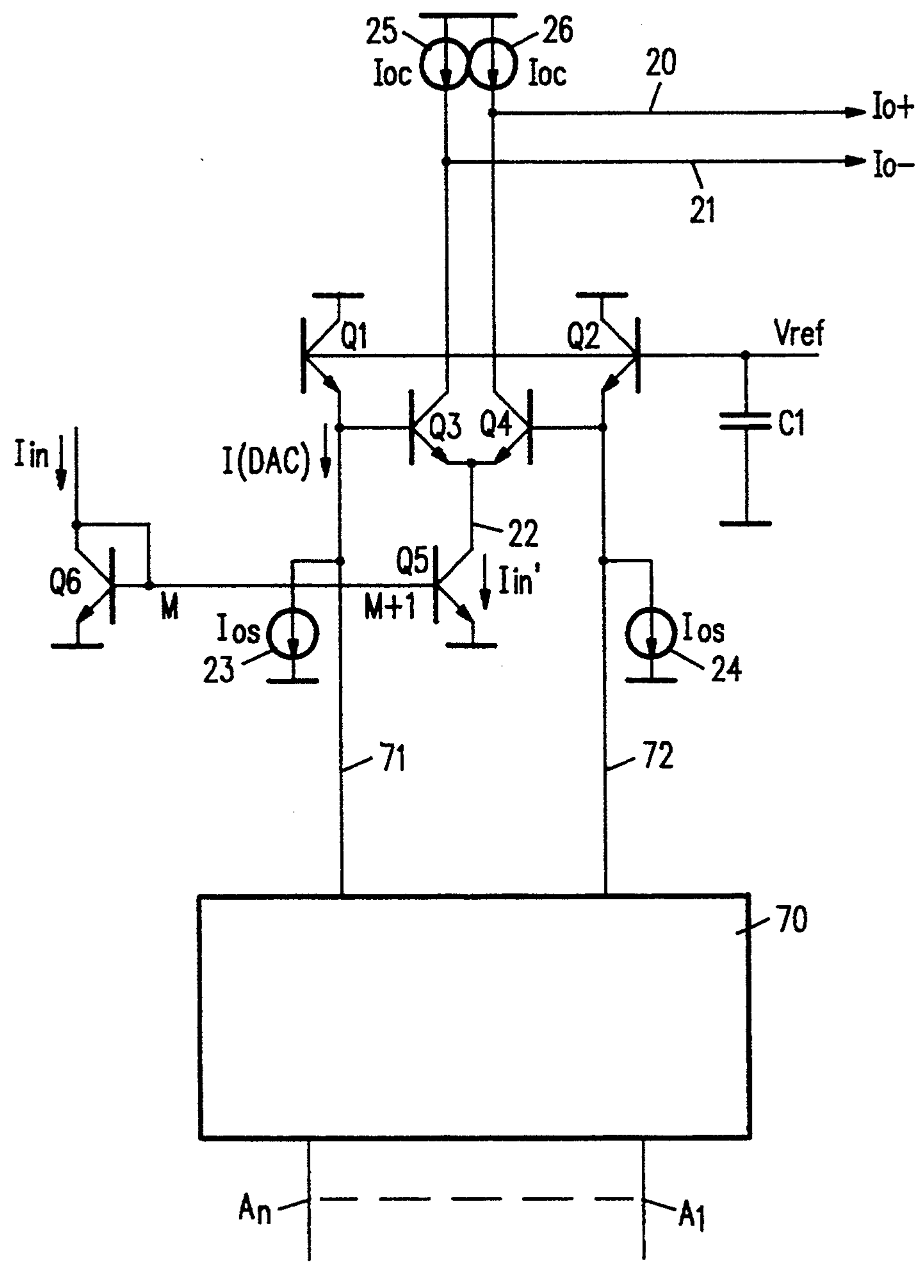
FIG. 7 illustrates a block diagram of a generic DAC incorporating the principles of this invention

FIG. 7 illustrates a block diagram which includes a generic current-multiplying DAC 70 which has digital input lines $A_1$–$A_n$ and differential output lines 71 and 72. The current in line 71 represents the digital input on lines $A_1$–$A_n$ and the current in line 72 represents the complement thereof. The remaining elements in FIG. 7 are identical to those shown in FIG. 2 and operate to provide a relatively glitch-free output despite parasitic capacitances of the components of DAC 70.

I claim:

1. A digital-to-analog converter for providing an output current in response to a digital input, said converter comprising:

a plurality of parallel conduction paths, each of said conduction paths being associated with a digit of a binary input to said digital-to-analog converter;

a common node conduction path connected to each of said parallel conduction paths;

a first transistor connected in said common node conduction path, said first transistor defining a reference voltage point in said common node conduction path; and an output line having a second transistor connected therein, a control terminal of said second transistor being connected to said reference voltage point, the voltage at said reference voltage point operative to determine the magnitude of an output current in said output line.

2. The digital-to-analog converter of claim 1 comprising a first current source connected to said common node conduction path.

3. The digital-to-analog converter of claim 2 wherein said first current source is operative to maintain a current flowing in said common node conduction path while said digital-to-analog converter is in operation.

4. The digital-to-analog converter of claim 2 comprising a second current source connected to said output current line.

5. The digital-to-analog converter of claim 4 wherein said second current source is operative to cancel a current flowing in said output line as a result of the current produced by said first current source, when the output of said digital-to-analog converter is at a minimum value.

6. The digital-to-analog converter of claim 4 comprising a current amplification means connected to said output current line, said current amplification means operative to provide a current in said output line of a magnitude which is at a predetermined ratio to the magnitude of an input current supplied to said current amplification means.

7. The digital-to-analog converter of claim 6 wherein said current amplification means comprises a pair of transistors, one of said pair of transistors being connected in said output line.

8. The digital-to-analog converter of claim 6 wherein said current amplification means is operative to ensure that the current in said output line is substantially equal to said input current when the output of said digital-to-analog converter is at a maximum value.

9. The digital-to-analog converter of claim 1 comprising a second output line for providing a second output current representative of the complement of said binary input.

10. The digital-to-analog converter of claim 1 comprising:

a second common node conduction path;

respective switching units connected to each of said parallel conduction paths, each of said switching units operative to switch a current in one of said parallel conduction paths to said common node conduction path or said second common node conduction path;

a third transistor connected to said second common node conduction path, said third transistor defining a second reference voltage point in said second common node conduction path; and a second output line having a fourth transistor connected therein, a control terminal of said fourth transistor being connected to said second reference voltage point, the voltage at said second reference voltage point operative to determine the size of a second output current in said second output line.

11. The digital-to-analog converter of claim 10 comprising a first current source connected to said common node conductor path and a second current source connected to said second common node conduction path.

12. The digital-to-analog converter of claim 11 comprising a third current source connected to said output line and a fourth current source connected to said second output line.

13. The digital-to-analog converter of claim 12 comprising a current amplification means connected to said second and fourth transistors.

14. The digital-to-analog converter of claim 10 comprising a current mirror means connected between said output line and said second output line, said current mirror means being for introducing a current to said output line which is substantially equal in magnitude to a current in said second output line.

15. The digital-to-analog converter of claim 14 wherein said current mirror means comprises a pair of transistors having their control terminals connected together.

16. The digital-to-analog converter of claim 14 wherein an output current in said output line is a bidirectional current, flowing in one direction when said binary input is at a maximum and the other direction when said binary input is at a minimum.

17. The digital-to-analog converter of claim 1 wherein each of said parallel conduction paths contains a cascoded transistor.

18. The digital-to-analog converter of claim 1 wherein a cascoded transistor is connected in series with said second transistor.

19. The digital-to-analog converter of claim 1 wherein each of said first and second transistors comprises a bipolar transistor.

20. A digital-to-analog converter having a common node current line, the magnitude of a current in said common node current line representing in analog form a binary input to said converter; and a reference voltage point in said common node current line, the voltage at said reference voltage point being for determining the magnitude of an output current in an output line of said digital-to-analog converter.

21. The digital-to-analog converter of claim 20 wherein the voltage at said reference voltage point varies substantially as the natural logarithm of the magnitude of a current in said common node current line.

22. The digital-to-analog converter of claim 21, said output line comprising a current regulating means, a control terminal of said current regulating means being connected to said reference voltage point.

23. The digital-to-analog converter of claim 22 wherein said current regulating means comprises a bipolar transistor.

24. A method of providing an output current for a digital-to-analog converter, said digital-to-analog converter comprising a line which carries a first current representative of a digital input to said converter, said method comprising:

creating a voltage representative of the magnitude of said first current; and providing said voltage to a current controlling means in an output line, said current controlling means regulating the size of a second current in said output line.

25. The method of claim 24 wherein said voltage varies substantially in proportion to the natural logarithm of said first current.

26. The method of claim 25 wherein the current controlling means comprises a bipolar transistor.

27. A digital-to-analog converter comprising:

a first current path which carries a current representative of a digital input to said converter, said first current path containing a first transistor;

a second current path which carries a current representative of the complement of said digital input, said second current path containing a second transistor, a third current path containing a third transistor;

a fourth current path containing a fourth transistor;

a point in said first current path being connected to a control terminal of said third transistor and a point in said second current path being connected to a control terminal of said fourth transistor;

wherein the currents in said transistors have substantially the following relationship when said converter is in operation $$\frac{I_{Q1}}{I_{Q2}} = \frac{I_{Q4}}{I_{Q3}}$$

where $I_{Q1}$ is the current through said first transistor, $I_{Q2}$ is the current through said second transistor, $I_{Q3}$ is the current through said third transistor, and $I_{Q4}$ is the current through said fourth transistor.

28. A digital-to-analog converter comprising:

a digital-to-analog conversion means comprising:

a plurality of digital input lines; and an intermediate output line;

the current in said intermediate output line being of a magnitude representative of a binary input on said input lines when said digital-to-analog conversion means is operative;

a first transistor connected to said intermediate output line, said first transistor defining a reference voltage point; and a second transistor in an output line, a control terminal of said second transistor being connected to said reference voltage point, the voltage at said reference voltage point operative to determine the size of an output current in said output line.

29. The digital-to-analog converter of claim 28 comprising a first current source connected to said intermediate output line.

30. The digital-to-analog converter of claim 29 comprising a second current source connected to said output line.

31. The digital-to-analog converter of claim 30 comprising a current amplification means connected to said output line, said current amplification means operative to provide a current in said output line of a magnitude which is at a predetermined ratio to the magnitude of an input current supplied to said current amplification means.

32. The digital-to-analog converter of claim 31 wherein said current amplification means comprises a pair of transistors, one of said pair of transistors being connected in said output line.

33. The digital-to-analog converter of claim 28 wherein said digital-to-analog conversion means comprises a second intermediate output line, the current in said second intermediate output line representing a complement of a binary input on said input lines when said digital-to-analog conversion means is operative;

a third transistor connected in said second intermediate output line, said third transistor defining a second reference voltage point in said second intermediate output line; and a second output line having a fourth transistor connected therein, a control terminal of said fourth transistor being connected to said second reference voltage point, the voltage at said second reference voltage point operative to determine the size of a second output current in said second output line.

34. The digital-to-analog converter of claim 33 comprising a first current source connected to said intermediate output line and a second current source connected to said second intermediate output line.

35. The digital-to-analog converter of claim 34 comprising a third current source connected to said output line and a fourth current source connected to said second output line.

36. The digital-to-analog converter of claim 35 comprising a current amplification means connected to said second and fourth transistors.

37. The digital-to-analog converter of claim 33 comprising a current mirror means connected between said output line and said second output line, said current mirror means introducing a current to said output line which is substantially equal in magnitude to a current in said second output line.

38. The digital-to-analog converter of claim 28 wherein said digital-to-analog conversion means comprises a plurality of conduction paths for carrying respective weighted binary currents.

39. The digital-to-analog converter of claim 28 wherein said digital-to-analog conversion means comprises a thermometer type digital-to-analog converter.

* * * * *